US010593844B2

(12) United States Patent
Hayashi et al.

(10) Patent No.: US 10,593,844 B2
(45) Date of Patent: Mar. 17, 2020

(54) LIGHT EMITTING DEVICE AND METHOD FOR MANUFACTURING THE SAME

(71) Applicant: NICHIA CORPORATION, Anan-shi, Tokushima (JP)

(72) Inventors: Tadao Hayashi, Tokushima (JP); Teruhito Azuma, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 93 days.

(21) Appl. No.: 15/170,411

(22) Filed: Jun. 1, 2016

(65) Prior Publication Data

US 2016/0351766 A1   Dec. 1, 2016

(30) Foreign Application Priority Data

Jun. 1, 2015   (JP) ................................. 2015-111795

(51) Int. Cl.
*H01L 33/60*   (2010.01)
*H01L 33/54*   (2010.01)
(Continued)

(52) U.S. Cl.
CPC ............ *H01L 33/60* (2013.01); *H01L 33/505* (2013.01); *H01L 33/507* (2013.01); *H01L 33/54* (2013.01);
(Continued)

(58) Field of Classification Search
CPC ......... H01L 33/60; H01L 33/58; H01L 33/52; H01L 33/54; H01L 33/56; H01L 23/10; H01L 23/24; H01L 23/3185; H01L 23/564; H01L 23/3135; H01L 33/505; H01L 33/507; H01L 33/486
See application file for complete search history.

(56) References Cited

U.S. PATENT DOCUMENTS 8,399,275 B2 *   3/2013   Akimoto ............... H01L 33/508
257/E21.529
8,921,877 B2 *  12/2014   Ito ......................... H01L 33/505
257/100

(Continued)

FOREIGN PATENT DOCUMENTS

JP   2010-192629 A   9/2010
JP   2010-219324 A   9/2010
(Continued)

OTHER PUBLICATIONS

Notification of Reasons for Refusal dated Apr. 4, 2017 in the corresponding Japanese Patent Application No. 2015-111795.

*Primary Examiner* — Jesse Y Miyoshi
(74) *Attorney, Agent, or Firm* — Foley & Lardner LLP

(57) ABSTRACT

A light emitting device includes a light transmissive member; a first reflector covering outer peripheral faces of the light transmissive member; a light emitting element disposed under the light transmissive member; a light guiding member covering at least a portion of the light transmissive member, a portion of a lower face of the first reflector, and at least some portions of lateral faces of the light emitting element; and a second reflector covering a portion of the lower face of the first reflector that is exposed from the light guiding member and is located outward of the light guiding member.

11 Claims, 8 Drawing Sheets

(51) Int. Cl.
  *H01L 33/56* (2010.01)
  *H01L 33/50* (2010.01)
  *H01L 33/48* (2010.01)

(52) U.S. Cl.
  CPC ............ *H01L 33/56* (2013.01); *H01L 33/486* (2013.01); *H01L 2933/0033* (2013.01); *H01L 2933/0058* (2013.01)

(56) References Cited

U.S. PATENT DOCUMENTS

| | | | | |
|---|---|---|---|---|
| 8,952,409 | B2* | 2/2015 | Ushiyama | H01L 33/486 257/100 |
| 2007/0145255 | A1* | 6/2007 | Nishikawa | B29C 45/1671 250/239 |
| 2007/0145393 | A1* | 6/2007 | Darbinian | H01L 33/483 257/98 |
| 2010/0264438 | A1* | 10/2010 | Suenaga | H01L 33/58 257/98 |
| 2010/0320479 | A1* | 12/2010 | Minato | H01L 33/505 257/88 |
| 2011/0297985 | A1* | 12/2011 | Naka | H01L 33/507 257/98 |
| 2012/0140506 | A1 | 6/2012 | Waragawa et al. | |
| 2013/0001605 | A1* | 1/2013 | Ishihara | H01L 33/505 257/88 |
| 2013/0240931 | A1* | 9/2013 | Akimoto | H01L 33/58 257/98 |
| 2014/0070248 | A1* | 3/2014 | Ushiyama | H01L 33/486 257/98 |

FOREIGN PATENT DOCUMENTS

| | | |
|---|---|---|
| JP | 2010-283281 A | 12/2010 |
| JP | 2012-129237 A | 7/2012 |
| JP | 2012-134355 A | 7/2012 |
| JP | 2013-012545 A | 1/2013 |
| JP | 2013-168685 A | 8/2013 |

* cited by examiner

LIGHT EMITTING DEVICE AND METHOD FOR MANUFACTURING THE SAME

CROSS-REFERENCE TO RELATED APPLICATIONS

The present application claims priority under 35 U.S.C. § 119 to Japanese Patent Application No. 2015-111795, filed Jun. 1, 2015. The contents of this application are incorporated herein by reference in their entirety.

BACKGROUND

The present disclosure relates to light emitting devices.

Light emitting devices having a reflector that covers the lateral faces of a light emitting element, in lieu of a housing for the light emitting element, are disclosed in, for example, Japanese Unexamined Patent Application Publication No. 2013-012545 and Japanese Unexamined Patent Application Publication No. 2010-219324. For increasing the light extraction efficiency of these light emitting devices, a light guiding member is disposed between the light emitting element and the reflector, and the light ejected from the lateral faces of the light emitting element is allowed to enter a light transmissive member, such as a phosphor sheet, via the light guiding member.

SUMMARY

The light emitting device according one embodiment of the invention includes: a light transmissive member; a first reflector covering outer walls of the light transmissive member; a light emitting element mounted under the light transmissive member; a light guiding member covering the light transmissive member, a portion of a lower face of the first reflector, and at least a portion of lateral faces of the light emitting element; and a second reflector covering the portion of the lower face of the first reflector that is exposed from the light guiding member, and exterior of the light guiding member.

DETAILED DESCRIPTION

Figure 1:
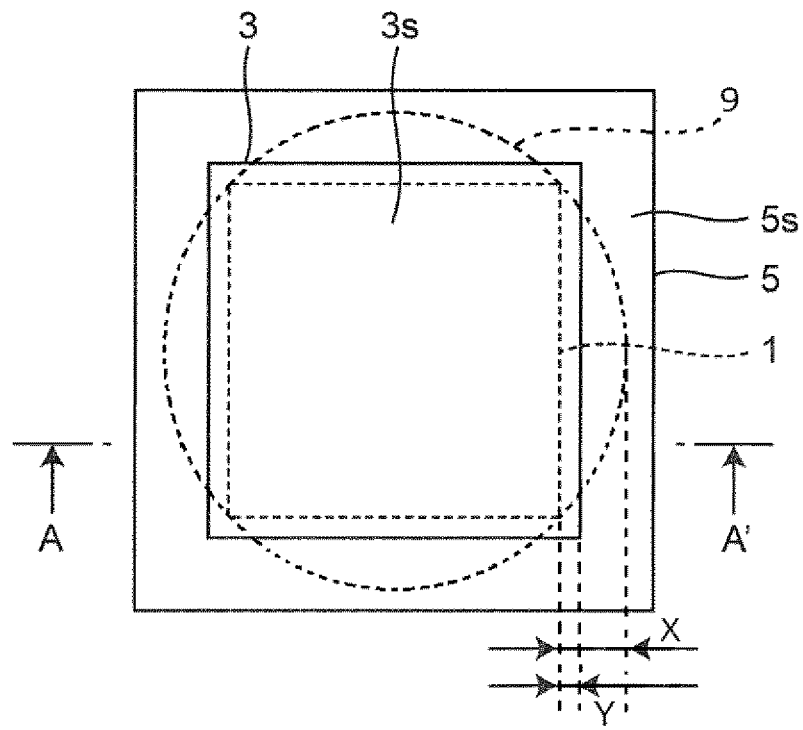
FIG. 1 is a top view of a light emitting device according to Embodiment 1 of the present invention.

Embodiments of the present invention will be explained in detail below based on drawings. In the explanations below, terms indicating certain directions and positions will be used as needed (for example, "upper," "lower," "right," "left," and other terms including these). These terms are used for the purpose of making the invention easily understood based on the drawings being referred to, and the technical scope of the invention should not be limited by the meanings of these terms. The portions denoted by the same reference numerals appearing in multiple drawings represent the same portions or components.

Light Emitting Device According to Embodiment 1

Figure 2:
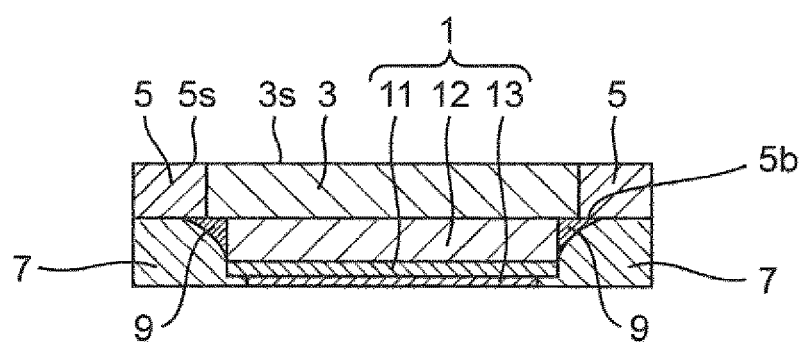
FIG. 2 is a schematic cross sectional view along line A-A' indicated in FIG. 1.
Figure 3:
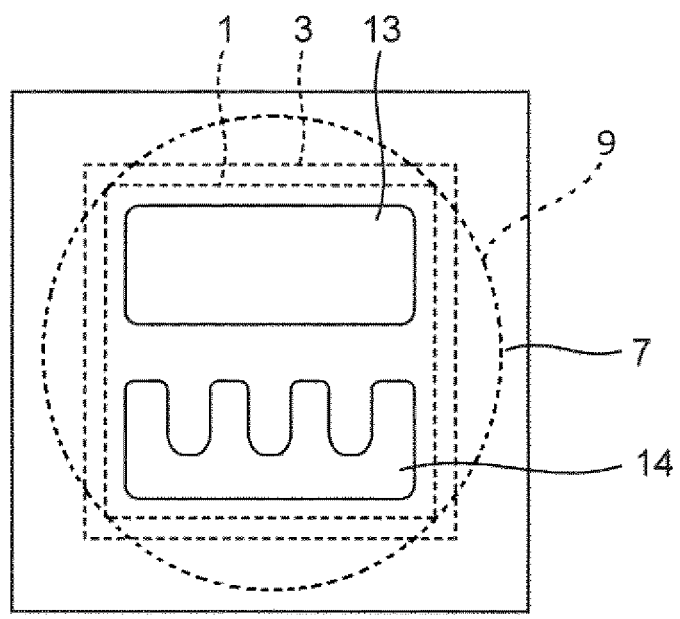
FIG. 3 is a schematic bottom view of the light emitting device of Embodiment 1.

FIG. 1 is a top view of a light emitting device according to Embodiment 1 of the invention, FIG. 2 is a sectional view along line A-A' indicated in FIG. 1, and FIG. 3 is a bottom view of the light emitting device according to Embodiment 1.

The light emitting device according to Embodiment 1 of the invention includes: a light emitting element 1 that has an upper face as an emission face and electrodes 13 and 14 disposed on a lower face opposite the emission face; a light transmissive member disposed on the emission face of the light emitting element 1; a first reflector 5 disposed to surround the light transmissive member 3; and a second reflector 7 disposed to surround the light emitting element 1.

Although the light extraction efficiency of these light emitting devices is improved, luminance irregularities could occur in the light transmissive member, requiring further improvement. An object of certain embodiments of the present invention is to provide a light emitting device with reduced luminance irregularities.

According to certain embodiments of the invention, a light emitting device with reduced luminance irregularities can be provided.

In the light emitting device according to Embodiment 1, the light emitting element 1 includes, for example, a light transmitting substrate 12 positioned on the emission face side, and a semiconductor stack 11 disposed on the face of the light transmitting substrate 12 opposite the emission face, wherein the electrodes 13 and 14 are formed on the surface of the semiconductor stack 11. The semiconductor stack 11 includes, for example, an n-type semiconductor layer and a p-type semiconductor layer, where the electrode 13 is connected to one of the n-type semiconductor layer and the p-type semiconductor layer and the electrode 14 is connected to the other of the n-type semiconductor layer and the p-type semiconductor layer. The semiconductor stack 11 may further include an emission layer between the n-type semiconductor layer and the p-type semiconductor layer.

In the light emitting device according to Embodiment 1, the light transmissive member 3 is disposed so that its lower face opposes the emission face of the light emitting element 1 to cover at least a portion of the emission face of the light emitting element 1, and the light emitted by the light emitting element is ejected after passing through the light transmissive member 3. In the light emitting device according to Embodiment 1, the light transmissive member 3, as shown in FIG. 1, is disposed so as to cover the entire emission face of the light emitting element 1, and its outer peripheral faces (outer lateral faces) are positioned outside the outer lateral faces of the light emitting element 1. In other words, the light emitting element 1 is disposed under the light transmissive member 3. The surface 3s, which is the upper face of the light transmissive member 3, makes up a portion of an upper face of the light emitting device as a light ejecting face. The light transmissive member 3 may contain a wavelength converting substance for converting the light emitted by the light emitting element 1 into light having a different wavelength.

In the light emitting device according to Embodiment 1, the first reflector 5 is disposed to cover the outer peripheral faces of the light transmitting member 3, preferably in contact with the light transmitting member 3. In this way, light leakage from the lateral faces of the light transmissive member 3 can be reduced, and the light transmissive member 3 can be retained. The first reflector 5 is preferably disposed in contact with the entire lateral faces of the light transmissive member 3, thereby effectively reducing light leakage from the lateral faces of the light transmissive member 3 and securely holding the light transmissive member 3.

In the light emitting device according to Embodiment 1, a surface 5s of the first reflector 5, for example, makes up a portion of the upper face of the light emitting device by surrounding a surface 3s which is the upper face of the light transmitting member 3, thereby clearly defining the boundary between the light ejecting face made of the surface 3s and a no light ejecting face made of the surface 5s at the upper face of the light emitting device.

In the light emitting device according to Embodiment 1, the lower face of the light transmissive member 3 and the lower face of the first reflector 5, which are substantially coplanar, make up the mounting face for mounting the light emitting element 1, and the emission face of the light emitting element 1 is bonded by a light guiding member 9 to the mounting face so as to oppose the lower face of the light transmissive member 3. In other words, in Embodiment 1, the light guiding member 9 concurrently functions as a die bonding member. In Embodiment 1, the light guiding member 9 is formed to cover the light transmissive member 3, a portion of the lower face of the first reflector 5, and at least some portions of the lateral faces of the light emitting element 1. The light guiding member 9 has oblique portions which spread out from the lateral faces of the light emitting element 1 towards the upper face side, i.e., towards the light transmissive member 3 as its outer faces are outwardly oblique. The light guiding member 9 is preferably a light transmissive resin because light needs to transmit therethrough. Moreover, for reducing color irregularities, it preferably contains substantially no wavelength converting substance. The light guiding layer formed between the light emitting element 1 and the light transmissive member 3 may formed to a thickness, for example, in a range between 2 µm and 30 µm, preferably in a range between 4 µm and 20 µm, more preferably in a range between about 5 µm and 10 µm.

In the light emitting device according to Embodiment 1, the second reflector 7 is disposed to cover the lateral faces and a portion of the lower face of the light emitting element 1, and surfaces of the electrodes 13 and 14 are exposed for external connection. The second reflector 7 is disposed in contact with the portion of the lower face of the first reflector 5 that is exposed from the light guiding member 9, and the light emitting element 1 is protected by both the second reflector 7 and the first reflector 5. By covering the exterior of the light guiding member 9 with the second reflector 7, the light ejected from the lateral faces of the light emitting element 1 can be reflected at the interface between the exterior of the light guiding member 9 and the second reflector 7 to be extracted through the light transmissive member 3, thereby increasing the light extraction efficiency of the light emitting device. The bottom face of the second reflector 7 is formed substantially flat, and the surfaces of the electrodes 13 and 14 are exposed at the bottom face. In the light emitting device of Embodiment 1, the bottom face of the second reflector 7, where the surfaces of the electrodes 13 and 14 are exposed, serves as the mounting face of the light emitting device.

The light emitting device of Embodiment 1 described above can be made compact as the outer walls of the light emitting device are structured with the second reflector 7 and the first reflector 5 without employing a separately prepared package.

The light emitting device of Embodiment 1 described above can configure the surface 5s of the first reflector 5 to surround the surface 3c of the light transmissive member 3, which is the light ejecting face, thereby clearly defining the boundary between the light ejecting surface and the no light ejecting surface to provide a light emitting device with good visibility.

The light emitting device of Embodiment 1 described above can reduce in-plane luminance irregularities occurring at the light transmissive member because the light guiding member 9 is disposed to extend across an interface between the light transmissive member 3 and the first reflector 5.

For more effectively reducing luminance irregularities, the width X of the light guiding member 9 disposed outside the light emitting element 1 is preferably in a range between 101% and 200% of the distance Y from the lateral face of the light emitting element 1 to the outer edge of the light transmissive member 3 in a plan view. The width X, as shown in FIG. 1, represents the distance from the lateral face of the light emitting element 1 to the end of the light guiding member 9. The amount of light that cannot be reflected by the first reflector 5 and thus absorbed or attenuated inside the light emitting device may increase as the area where the first reflector is joined with the light guiding member 9 increases, which may reduce the light extraction efficiency. The width X (i.e., distance X), moreover, is preferably in a range between 100 µm and 200 µm, for example, more preferably in a range between 100 µm and 150 µm.

The luminance distributions at the surface 3s which is the upper face of the light transmissive member 3 of the light emitting device shown in FIGS. 1-3 were simulated to determine the preferable range of the disposition locations for the light guiding member 9.

Figure 9:
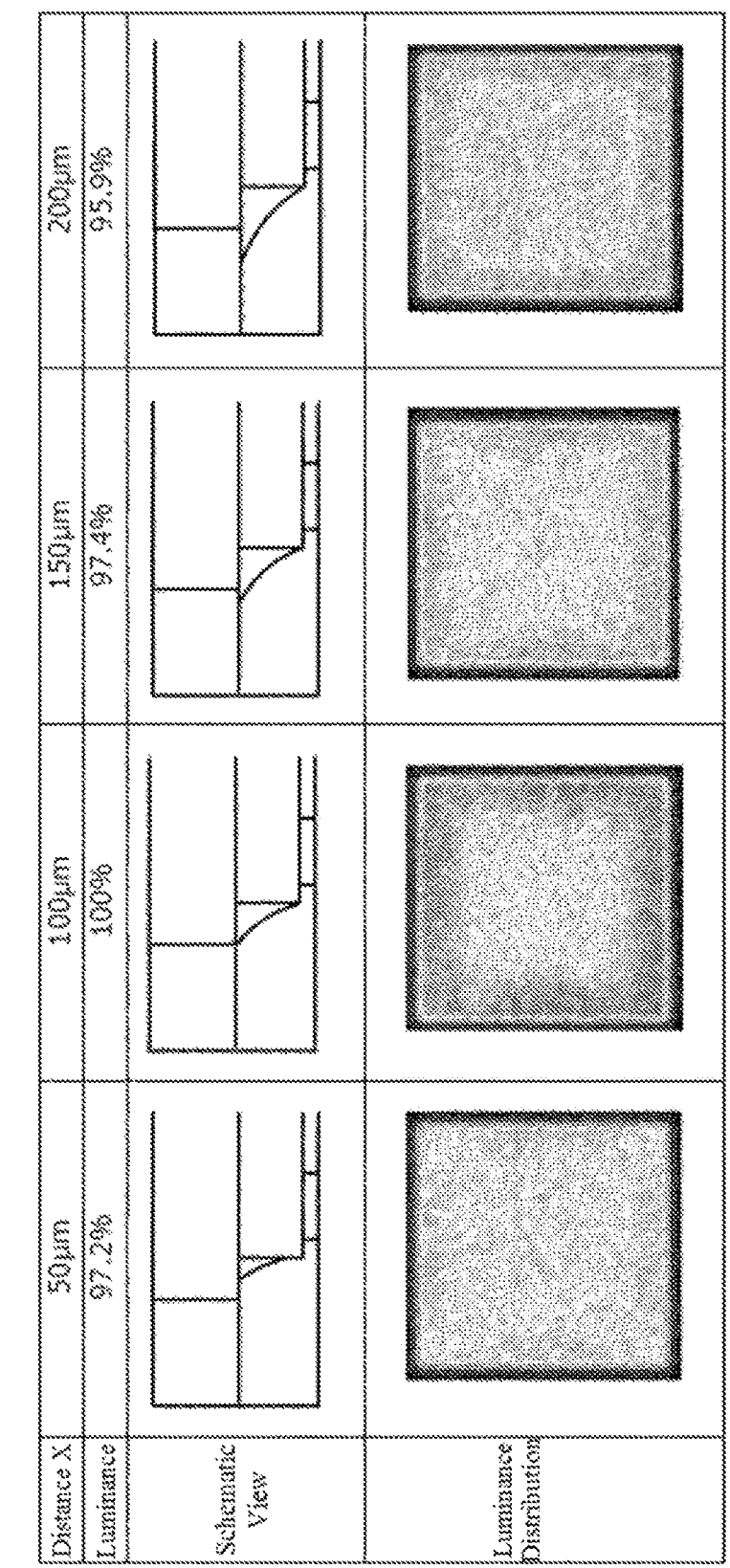
FIG. 9 is a schematic chart showing the luminance distribution simulation results.

FIG. 9 shows the distances X of the light guiding members 9 of the four types of light emitting devices used in the simulations. The light emitting elements used in the simulations were nitride semiconductor light emitting elements each being a 600 µm square in a plan view, and the light transmissive members 3 contained a phosphor. With respect to the luminance (luminous flux), the relative luminance of each light emitting device was simulated assuming that the luminance was 100% when X=100 µm.

As can be understood from FIG. 9, when X=100 µm, i.e., the outer edge of the light guiding member 9 coincides with the end of the first reflector 5, luminance irregularities are relatively extensive. This is because the light propagating inside the light guiding member 9 tends to be easily concentrated in the end portion of the light guiding member 9, and when the end of the guiding member 9 coincides with the end of the first reflector 5, the concentrated light may be extracted from the surface 3s in as-is condition along the interface between the first reflector 5 and the light transmissive member 3.

On the other hand, when the end of the light guiding member 9 does not coincide with the end of the first reflector 5, i.e., when X=50 µm, X=150 µm, and X=200 µm, as shown in FIG. 9, luminance irregularities are reduced.

When the light guiding member 9 is smaller than the outline of the light transmissive member 3 as in the case of X=50 μm, the light concentrated in the end portion of the light guiding member 9 may be scattered by phosphor particles inside the light transmissive member 3, which reduces luminance irregularities.

When the light guiding member 9 is formed to extend onto the first reflector 5 as in the case of X=150 μm or X=200 μm, the light concentrated in the end portion of the light guiding member 9 may be reflected or absorbed by the lower face of the first reflector 5, which reduces luminance irregularities. Moreover, the results also show that the luminance may be higher in the case of 150 μm than in the case of 200 μm.

In the light emitting device of Embodiment 1, as shown in FIG. 1 for example, the region where the light guiding member 9 is joined with the mounting face for the light emitting element 1 is circular in shape in a plan view. The corners of the light transmissive member 3 are exposed from the light guiding member 9, but the locations where the end of the light guiding member 9 coincide with the end of the first reflector 5 exist only as points. This can reduce luminance irregularities.

According to the simulation results, luminance irregularities are also reduced when X=50 but when the light transmissive member 3 contains a wavelength converting substance, color irregularities may become apparent in the area where the light guiding member 9 and the light transmissive member 3 are not joined because the amount of light from the light emitting element 1 which is directly extracted without undergoing wavelength conversion is decreased. For this reason, it is preferable to reduce as much as possible the area where the light guiding member 9 and the light transmissive member 3 are not joined. It is thus preferable to have the light guiding member 9 cover at least 70%, more preferably at least 80%, yet more preferably at least 90% of the lower face of the light transmissive member 3, for example.

The light emitting device of Embodiment 1 constructed as above can be manufactured by the manufacturing method described below, and thus can be manufactured inexpensively.

The light emitting device of Embodiment 1 constructed as above can be manufactured by the manufacturing method described below. Thus, by allowing the light transmissive member 3 to contain a wavelength converting substance, light emitting devices containing various wavelength converting substances can be produced.

With respect to the light emitting device of Embodiment 1 described above, FIG. 2 shows an example in which the light transmissive member 3 has a substantially flat surface 3s, which is the light ejecting face. However, the light emitting device is not limited to those having a flat light ejecting face, and may have a concave face or a convex face. The light ejecting face may also be an irregular surface.

Manufacturing Method for the Light Emitting Device According to Embodiment 1

The manufacturing method for the light emitting device according to Embodiment 1 is includes preparing a sheet-form reflecting member, creating openings on the sheet-form reflecting member thereby forming first reflectors, forming a light transmissive member for disposing light transmissive members in the openings, mounting a semiconductor element, forming a second reflector, and separating.

Preparation Reflecting Member

Figure 4A:
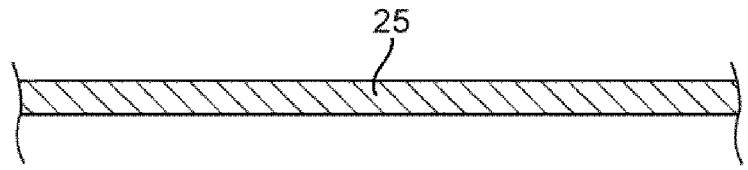
FIGS. 4A to 4G are schematic cross sectional views depicting a method for producing the light emitting device according to Embodiment 1.

In the manufacturing method of Embodiment 1, in the reflecting member preparation step, as shown in FIG. 4A, a sheet-form reflecting member 25 is prepared. The reflecting member 25 is formed by curing a resin containing a light reflecting substance, for example.

Forming First Reflector

Figure 4B:
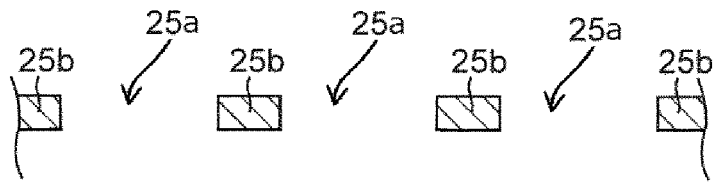

In the first reflector forming step, as shown in FIG. 4B, first reflectors are formed by creating openings 25a in the reflecting member 25. The openings 25a are formed to match the shape of the light transmissive members 3. Here, the openings 25a may be through holes, or recesses having bottom faces. Any method known in the art may be used to form the openings 25a. Examples include laser beam irradiation or drawing, punching, etching, blasting, and the like. A plurality of openings 25a are created in rows and columns in a plan view in this embodiment. This forms a first resin frames 25b which will become first reflectors 5 when separated into individual light emitting devices. The first resin frames are formed in a lattice pattern in a plan view.

The first reflector forming step may be performed by using a mold. In this case, the first reflectors each having an opening 25a are formed using a mold having the portions that correspond to the openings 25a by transfer molding, injection molding, or the like.

Forming Light Transmissive Member

The light transmissive member forming step, in the case of forming light transmissive members 3 containing a wavelength converting substance such as a phosphor, for example, may include a second resin layer forming step, a wavelength converting substance sedimentating step for sedimentation the phosphor by, for example, centrifugation, and a second resin layer curing step.

Figure 4C:
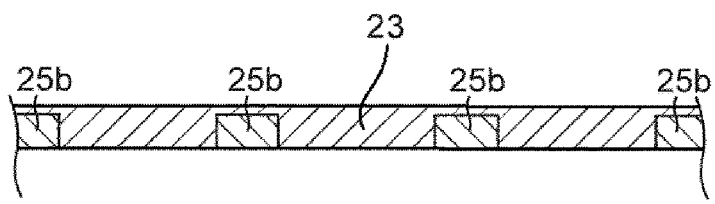

In the second resin layer forming step, as shown in FIG. 4C, the second resin layer 23 is formed so as to fill the openings 25a and cover the first resin frames 25b, for example, with a phosphor-containing second resin by, for example, potting.

In the wavelength converting substance sedimentation step, the wavelength converting substance contained in the second resin layer 23 is settled towards the bottom.

In the second resin layer curing step, the second resin layer 23 is cured in the state in which the wavelength converting substance is settled. According to the light transmissive member forming step described above, light emitting devices can be produced using various wavelength converting substances.

Figure 4D:
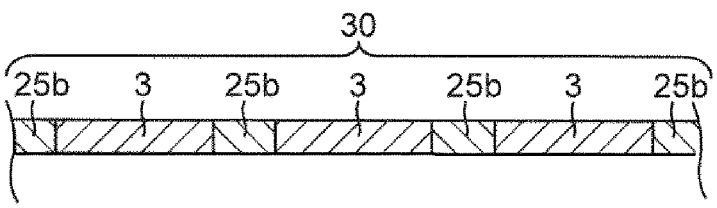

Moreover, as shown in FIG. 4C, in the cases where the second resin layer 23 is formed to fill the openings 25a and cover the first resin frames 25b, the light transmissive member forming step further includes a removing step after curing the second resin layer 23. In the removing step, as shown in FIG. 4D, the second resin layer 23 is ground from the upper face, for example, so as to reduce the second resin layer 23 filling the openings 25a to a given thickness and to remove the second resin layer 23 disposed on the first resin frames 25b. The first resin frames 25b may be ground at the same time in addition to a portion of the second resin layer 23. The second resin layer 23 will become the light transmissive members 3.

The light transmissive member forming step may be adapted so as to form the second resin layer 23 of a prescribed thickness in each opening 25 without forming the second resin layer 23 on the first resin frames 25b by filling each opening 25a with a prescribed amount of the second resin layer 23, for example. In this case, the removing step may not be needed.

In these ways, a combination sheet 30 composed of the first resin frames 25b and the light transmissive members 3 retained by the first resin frames 25b can be formed. A supporting member 40 may be attached to one face of the combination sheet as needed as shown in FIG. 4E.

Mounting Light Emitting Element

Figure 4E:
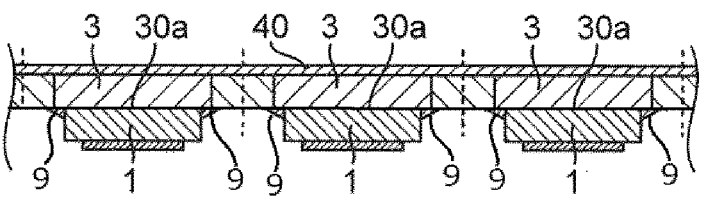

In the light emitting element mounting step, as shown in FIG. 4E, light emitting elements 1 are bonded to the combination sheet using a die bonding resin. The die bonding resin may be made of, for example, a light transmissive resin. The die bonding resin forms light guiding members 9 between the light emitting elements 1 and the light transmissive members 3, and in the surrounding of the light emitting elements 1. For effective extraction of light via the light transmissive members 3, the light emitting elements 1 are preferably bonded to the lower face of the light transmissive members 3. By forming the light guiding members 9 so that their one end reaches the first resin frames 25b, the light guiding members 9 each extending across an interface between the light transmissive member 3 and the first resin frame 25b can be formed. This can spread the light guiding member 9 across substantially the entire lower face of the light transmissive member 3 to allow light to enter across substantially the entire face of the light transmissive member 3. This can reduce luminance irregularities at the emission face.

Forming Second Reflector

In this embodiment, the second reflector forming step includes a third resin forming step and a third resin layer grinding step.

Figure 4F:
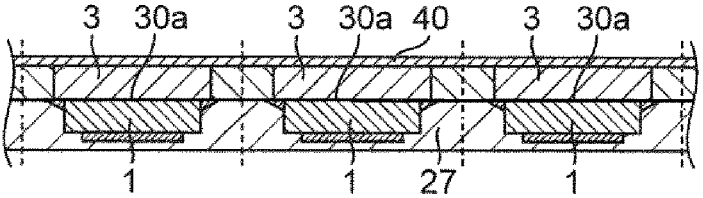

In the third resin forming step, as shown in FIG. 4F, a third resin 27 containing a light reflecting substance, for example, is formed to cover the light emitting elements 1 bonded to the combination sheet and in contact with the first resin frames 25b. It is preferable to form the third resin 27 so as to be in contact with the exterior of the light guiding member 9, and this can increase the light extraction efficiency.

Figure 4G:
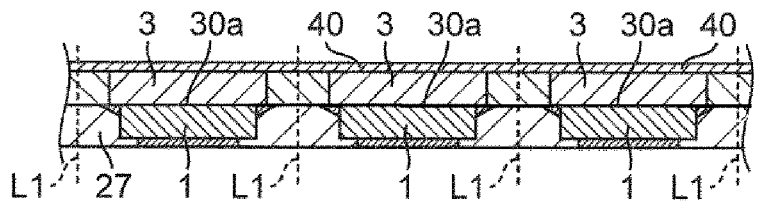

In the third resin layer grinding step, as shown in FIG. 4G, the third resin 27 is ground from its lower face to expose the electrodes 13 and 14 of the light emitting elements.

Separating

In the separating step, the light emitting devices may be separated into individual pieces by cutting the first resin and the third resin along the dividing lines L1 indicated in FIG. 4G by dicing, or the like, after detaching the support member 40 or together with the support member 40.

In the manner described above, the light emitting device of Embodiment 1 shown in FIGS. 1-3 can be produced.

Light Emitting Device According to Embodiment 2

Figure 5:
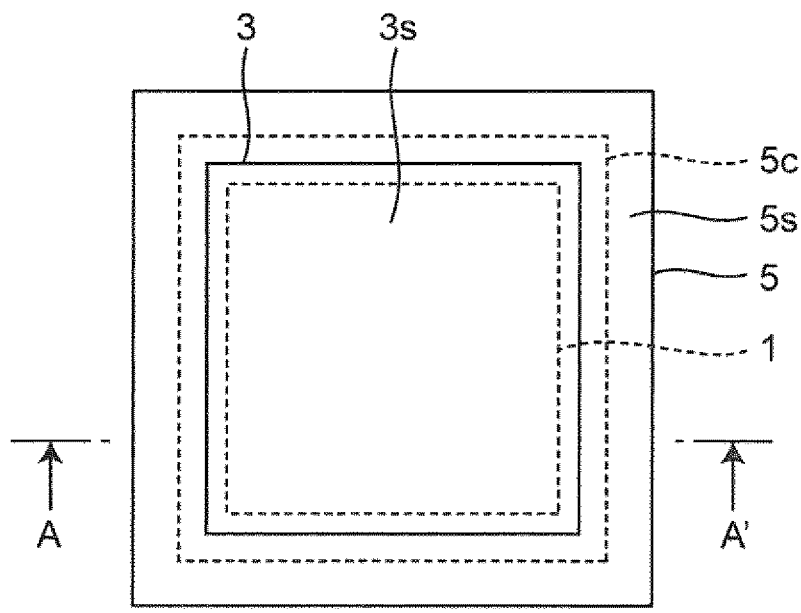
FIG. 5 is a schematic top view of the light emitting device according to Embodiment 2 of the present invention.
Figure 6:
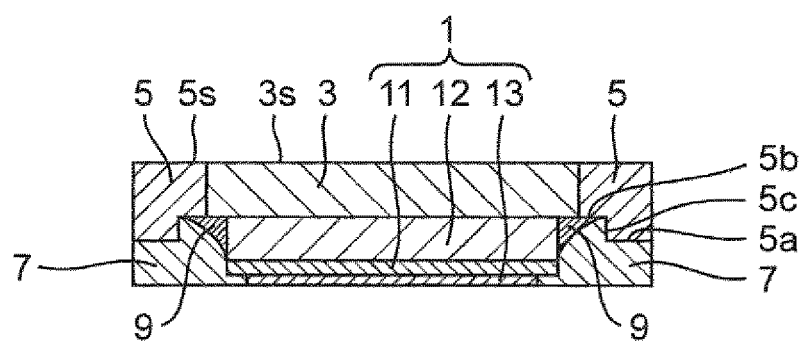
FIG. 6 is a schematic sectional view along line A-A' indicated in FIG. 4.
Figure 7:
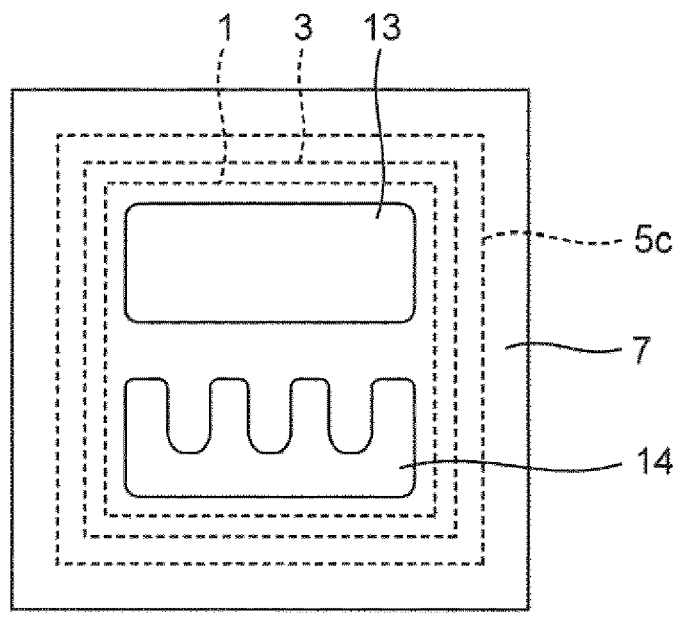
FIG. 7 is a schematic bottom view of the light emitting device of Embodiment 2.

The light emitting device according to Embodiment 2, as shown in FIGS. 5-7, differs from the light emitting device according to Embodiment 1 such that the first reflector 5 which is in contact with the light transmissive member 3 has a first bottom face 5a positioned lower than the lower face of the light transmissive member 3, creating a difference in level with the second bottom face 5b which is substantially coplanar with the lower face of the light transmissive member 3 such as that shown in FIG. 6. In the light emitting device of Embodiment 2, the lower face of the light transmissive member 3 and the second bottom face 5b, which are substantially coplanar, provide the mounting face for mounting the light emitting element 1, and the emission face of the light emitting element 1 is bonded by the light guiding member 9 to the mounting face so as to oppose the lower face of the light transmissive member 3. This forms a light guiding member 9 on the inside of the inner peripheral faces 5c of the first reflector 5, which are positioned between the first bottom face 5a and the second bottom face 5b, along the lateral faces of the light emitting element 1.

In the light emitting device of Embodiment 2 described above, a shape of the joining face of the light guiding member 9 can be controlled by the difference in level of the first reflector 5, and thus the light guiding member 9 can be formed to have a larger outer perimeter than the outer perimeter of the light transmissive member 3. As shown in FIG. 6, the light transmissive member 3 can be entirely covered by the light guiding member 9 at the joining face, and the first reflector 5 can be covered by the light guiding member 9 along the entire perimeter of the light transmissive member 3. This is because the light guiding member 9 is dammed up by the difference in level thereby wet-spreading along the inner peripheral faces 5c. This can not only reduce luminance irregularities, but also reduce color irregularities at the surface 3s which is the upper face of the light transmissive member 3. In this embodiment, the light transmissive member 3 is a quadrangle in a plan view. With respect to the locations of the inner peripheral faces 5c in a plan view, however, the effects similar to those of this embodiment can be achieved so long as the outline is shaped substantially similar to, and larger than, the outer perimeter of the light transmissive member 3.

Manufacturing Method for the Light Emitting Device According to Embodiment 2

The light emitting device manufacturing method according to Embodiment 2, as compared to the manufacturing method for the light emitting device according to Embodiment 1, uses a baseplate 20 and a mold 250 to form the first reflector having a difference in level, as shown in FIGS. 8A-8G. It is otherwise constructed in similar manner to in the production method of Embodiment 1.

The method for producing the light emitting device according to Embodiment 2 may include preparing a baseplate, forming a first reflector, forming a light transmissive member, mounting a light emitting element, forming a second reflector, and separating. In this manufacturing method, the first reflector forming step and the light transmissive member forming step are performed on the baseplate 20 prepared at the baseplate preparation step.

Preparing Baseplate

In the manufacturing method of Embodiment 2, in the baseplate preparation step, a baseplate 20 having protrusions 21a in the areas corresponding to the positions at which light emitting elements will be disposed is prepared. The protrusions 21a are formed on a plate surface 21 of the baseplate 20. The baseplate 20, for example, is made of a metal, such as SUS, and the protrusions 21a are formed by machining the plate surface. The shape of the protrusion 21a is determined based on the shape of the light emitting element 1, and for example, the upper face of the protrusion is formed slightly larger than the upper face shape of the light emitting element 1 for easily mounting the light emitting element 1.

The baseplate can be used repeatedly, and thus the baseplate preparation step is not something that is always required before the first reflector forming step.

Forming First Reflector

Figure 8A:
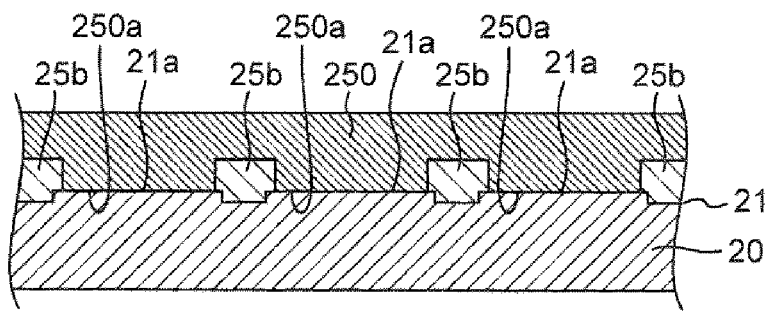
FIGS. 8A to 8G are schematic cross sectional views depicting a method for producing the light emitting device according to Embodiment 2.
Figure 8B:
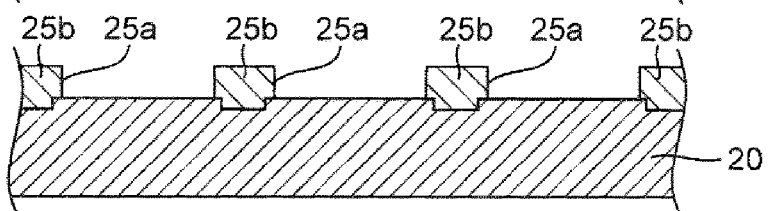
Figure 8C:
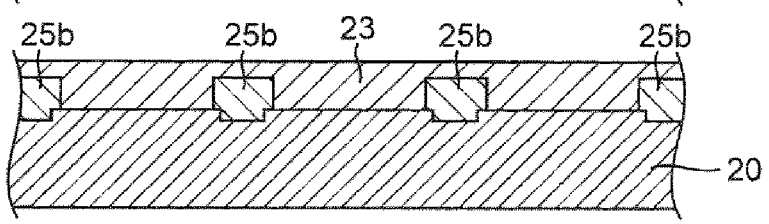
Figure 8D:
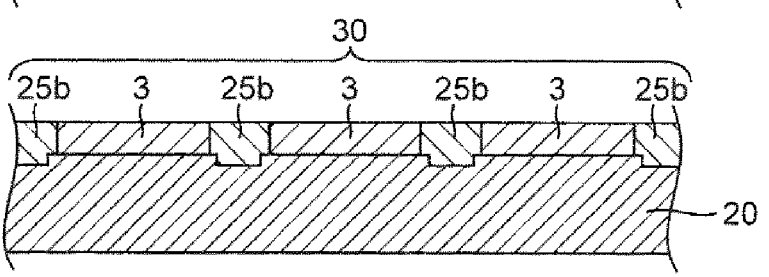
Figure 8E:
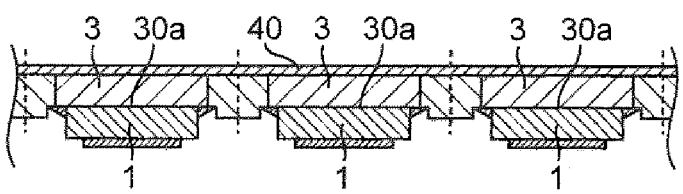
Figure 8F:
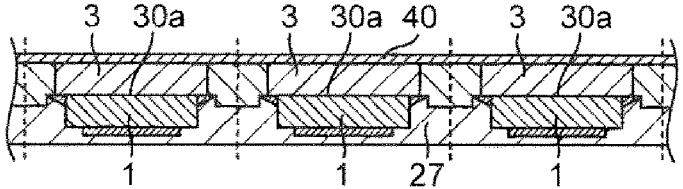
Figure 8G:
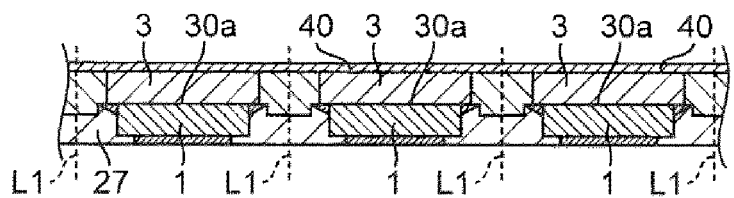

In the manufacturing method of Embodiment 2, in the first reflector forming step, as shown in FIG. 8A for example, a mold 250 is placed on the plate surface 21 side of the baseplate 20, and the first resin frames 25b each having an opening above the protrusion 21a are formed in a lattice pattern by transfer molding, injection molding, or the like. More specifically, a mold 250 having mold protrusions 250a located in correspondence with the protrusions 21a of the base plate 20 is placed so as to bring the upper faces of the mold protrusions 250a into contact with the upper faces of the protrusions 21a to create cavities having a matching shape to the first resin frame 25a at the periphery of the protrusions 21 and the mold protrusions 250a. The cavities are filled with a first resin containing a light reflecting substance, for example, and then cured. In this way, the first resin frames 25b are formed which will become the first reflectors 5 when separated into individual light emitting devices.

Subsequent to the first reflector forming step, the light transmissive member forming step, the light emitting element mounting step, the second reflector forming step, and the separating step are performed in similar manner to in the manufacturing method of Embodiment 1. The dividing lines L1 are the lines for separating 5a which will become the first bottom faces when separated into individual devices.

Materials for each member included in the light emitting devices according to the embodiments will be explained below.

Light Emitting Element 1

For the light emitting element 1, a semiconductor light emitting element, such as a light emitting diode chip, can be used. The semiconductor light emitting element may include a light transmitting substrate 12 and a semiconductor stack 11 formed thereon.

Light Transmitting Substrate 12

For the light transmitting substrate 12, for example, a light transmissive insulating material, such as sapphire ($Al_2O_3$) or spinel ($MgAl_2O_4$), or a semiconductor material that allows the emitted light from the semiconductor stack 11 to transmit therethrough (e.g., a nitride-based semiconductor material) can be used.

Semiconductor Stack 11

The semiconductor stack 11 includes, for example, plural semiconductor layers, such as an n-type semiconductor layer, an emission layer (that is, active layer), and a p-type semiconductor layer. The semiconductor layers can be formed using semiconductor materials, such as group III-V compound semiconductors, group II-VI compound semiconductors, or the like. More specifically, a nitride-based semiconductor material, such as an $In_XAl_YGa_{1-X-Y}N$ ($0 \leq X$, $0 \leq Y$, $X+Y \leq 1$) or the like (e.g., InN, AlN, GaN, InGaN, AlGaN, InGaAlN, or the like) can be used.

Electrodes 13 and 14

For the electrodes 13 and 14 of the light emitting element 1, a good conductor of electricity can be used, and for example, a metal such as Cu is suitable.

Light Transmissive Resin used as Light Guiding Member

For the light transmissive resin, particularly, thermosetting light transmissive resins, such as silicone resins, silicone modified resins, epoxy resins, and phenol resins can be used.

Moreover, since the light transmissive resin is in contact with the lateral faces of the light emitting element 1, it may be affected by the heat generated at the light emitting element 1 when turned on. In this regard, thermosetting resins with highly heat resistant are suited for the light transmissive resin.

First Reflector 5 and Second Reflector 7

The first reflector 5 and the second reflector 7 can be constructed with a light reflecting resin. A light reflecting resin means a resin having a high reflectance, for example, a reflectance of 70% or higher, relative to the light from the light emitting element.

For the light reflecting resin, for example, a light transmissive resin in which light reflecting substance is dispersed can be used. Examples of suitable light reflecting substances include titanium oxide, silicon dioxide, titanium dioxide, zirconium dioxide, potassium titanate, alumina, aluminum nitride, boron nitride, and mullite. A light reflecting substance in granular, fibrous, or thin flake form can be used. The fibrous form is preferable as it can reduce the coefficients of thermal expansion of the first reflector 5 and the second reflector 7 thereby reducing, for example, the differences in the thermal expansion coefficient between these and the light emitting element 1. For the resin material used as the light reflecting resin, thermosetting light transmissive resins, such as silicone resins, silicone modified resins, epoxy resins, and phenol resins are preferable.

Light Transmissive Member 3

For the light transmissive resin used in the light transmissive member 3, thermosetting resins, such as silicone resins, silicone modified resins, epoxy resins, and phenol resins, and thermoplastic resins, such as polycarbonate resins, acrylic resins, methylpentane resins, and polynorbornene resins can be used. Particularly, silicone resins which have highly light resistant and highly heat resistant are suitable.

Figure 10:
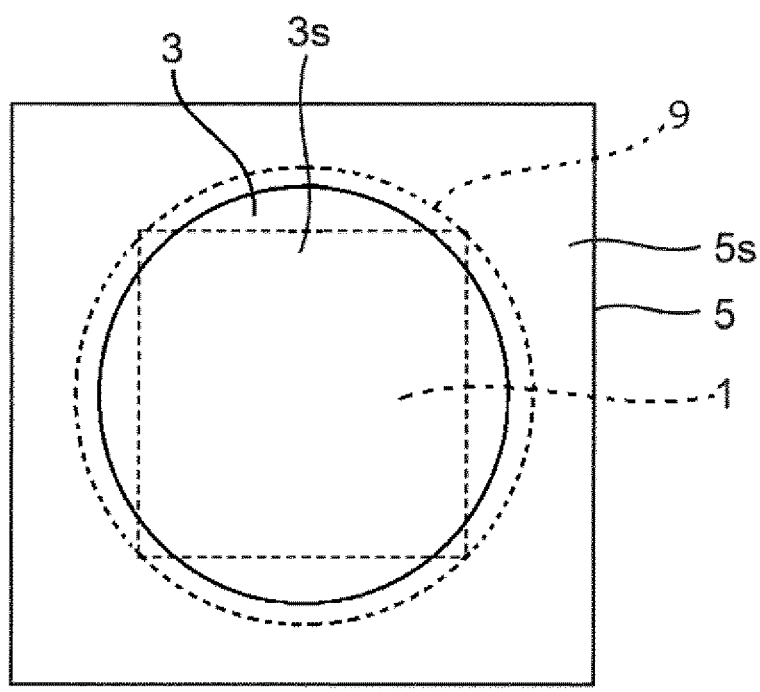
FIG. 10 is a schematic drawing showing one example of the shape of the light transmissive member 3.

The shape of the surface 3s which is the upper face of the light transmissive member 3 may be a circle, an oval, or a quadrangle with rounded corners besides a square, and can be changed to any shape by taking into account the use in combination with a secondary optical system such as a lens, for example. In the case of a circular shape, by making the surface 3s of the light transmissive member 3 similar to the outline of the light guiding member 9 as shown in FIG. 10, a light emitting device having even better color regularities can be produced.

The thickness of the light transmissive member 3 is preferably in a range between 10 μm and 300 μm, more preferably in a range between 50 μm and 200 μm.

Phosphor used as Wavelength Converting Substance

It goes without saying that those phosphors that can be excited by the emitted light from the light emitting element 1 are used. as the wavelength converting substance Examples of phosphors excitable by light emits from a blue light emitting element or ultraviolet light emitting element include cerium-activated yttrium aluminum garnet-based phosphors (Ce:YAG); cerium-activated lutetium aluminum garnet-based phosphors (Ce:LAG); europium- and/or chromium-activated nitrogen-containing calcium aluminosilicate-based phosphors ($CaO$—$Al_2O_3$—$SiO_2$); europium-activated silicate-based phosphors (($Sr,Ba)_2SiO_4$); nitride-based phosphors, such as β-SiAlON phosphors, CASN-based phosphors, SCASN-based phosphors; KSF-based phosphors ($K_2SiF_6$:Mn); sulfide-based phosphors, and quantum dot phosphors. By combining these phosphors with a blue or ultraviolet light emitting element, light emitting devices of various emission colors (e.g., a white light emitting device) can be produced.

Several embodiments of the invention have been exemplified in the forgoing. It goes without saying, however, that the invention is not limited to those described above. Other embodiments are possible, so long as they do not deviate from the spirit and the scope of the invention.

What is claimed is:

1. A light emitting device comprising:
a light transmissive member;
a first reflector covering outer peripheral faces of the light transmissive member;
a light emitting element disposed under the light transmissive member, the light emitting element comprising a plurality of electrodes at a lower face of the light emitting element;
a light guiding member, wherein the light guiding member directly contacts both (i) at least a portion of a lower face of the light transmissive member, and (ii) a portion of a lower face of the first reflector, and wherein the light guiding member covers at least some portions of lateral faces of the light emitting element; and a second reflector having an upper face that directly contacts a portion of the lower face of the first reflector that is exposed from the light guiding member and is located laterally outward of the light guiding member, wherein the electrodes of the light emitting element are exposed from a lower face of the second reflector, and wherein an uppermost face of the light emitting device is formed by an upper face of the light transmissive member and an upper face of the first reflector.

2. The light emitting device according to claim 1, wherein the light guiding member is substantially free of any wavelength converting substance.

3. The light emitting device according to claim 1, wherein an exterior of the light guiding member is outwardly oblique from the lateral faces of the light emitting element in an upward direction.

4. The light emitting device according to claim 1, wherein a width of the light guiding member disposed outward of the light emitting element is in a range of 101% and 200% of a distance between the lateral faces of the light emitting element and an outer edge of the light transmissive member.

5. The light emitting device according to claim 1, wherein a width of the light guiding member disposed outward of the light emitting element is in a range of 100 μm and 200 μm.

6. The light emitting device according to claim 1, wherein a thickness of the light transmissive member is in a range of 50 μm and 200 μm.

7. The light emitting device according to claim 1, wherein the first reflector and the second reflector are made of a resin containing a light reflecting substance.

8. The light emitting device according to claim 1, wherein the light transmissive member comprises a resin containing a wavelength converting substance.

9. The light emitting device according to claim 1, wherein at least 80% of a lower face of the light transmissive member is covered by the light guiding member.

10. The light emitting device according to claim 1, wherein corners of the light transmissive member are exposed from the light guiding member.

11. The light emitting device according to claim 1, wherein the first reflector is located entirely outward of the light emitting element in a top view of the light emitting device.

* * * * *